(12) United States Patent
Yu et al.

(10) Patent No.: US 7,889,530 B2
(45) Date of Patent: Feb. 15, 2011

(54) RECONFIGURABLE CONTENT-ADDRESSABLE MEMORY

(75) Inventors: Robert Yu, Newark, CA (US); Dave Trossen, Berkeley, CA (US); Jack Liu, Santa Clara, CA (US); Mukunda Krishnappa, Cupertino, CA (US); Kevin James, Santa Clara, CA (US)

(73) Assignee: Agate Logic Inc., Cupertino, CA (US)

( * ) Notice: Subject to any disclaimer, the term of this patent is extended or adjusted under 35 U.S.C. 154(b) by 677 days.

(21) Appl. No.: 11/855,721

(22) Filed: Sep. 14, 2007

(65) Prior Publication Data

US 2009/0077308 A1  Mar. 19, 2009

(51) Int. Cl.
*G11C 15/00* (2006.01)
(52) U.S. Cl. ................ 365/49; 365/189.05; 365/189.07
(58) Field of Classification Search .................... 365/49, 365/189.05, 189.07; 711/108
See application file for complete search history.

(56) References Cited

U.S. PATENT DOCUMENTS

| 6,374,326 | B1 * | 4/2002 | Kansal et al. | 711/108 |
| 6,903,953 | B2 * | 6/2005 | Khanna | 365/49.17 |
| 7,117,300 | B1 * | 10/2006 | James et al. | 711/108 |

* cited by examiner

*Primary Examiner*—Son Dinh
(74) *Attorney, Agent, or Firm*—James M. Wu; JW Law Group

(57) ABSTRACT

A system for determining memory addresses including a first content-addressable memory (CAM) configured to generate a first matchvector based on a first key; a first inverse-mask-reverse (IMR) module operatively connected to the first CAM, where the first IMR module is configured to generate a first auxiliary matchvector based on the first matchvector; and a first priority encoder (PE) operatively connected to the first IMR module, where the first PE is configured to output a first encoded memory address based on the first auxiliary matchvector, where the first CAM, the first IMR module, and the first PE are associated with a first reconfigurable content-addressable memory (RCAM).

24 Claims, 10 Drawing Sheets

RECONFIGURABLE CONTENT-ADDRESSABLE MEMORY

CROSS-REFERENCE TO RELATED APPLICATIONS

The present application also contains subject matter that may be related to the subject matter in U.S. application Ser. No. 11/855,666 entitled: "Heterogeneous Configurable Integrated Circuit", filed on Sep. 14, 2007, and assigned to the assignee of the present invention.

The present application contains subject matter that may be related to the subject matter in U.S. application Ser. No. 11/901,182 entitled: "High-Bandwidth Interconnect Network for an Integrated Circuit", filed on Sep. 14, 2007, and assigned to the assignee of the present application.

The present application also contains subject matter that may be related to the subject matter in U.S. application Ser. No. 11/855,697 entitled: "System and Method for Parsing Frames", filed on Sep. 14, 2007, and assigned to the assignee of the present invention.

The present application also contains subject matter that may be related to the subject matter in U.S. application Ser. No. 11/855,740 entitled: "Memory Controller for Heterogeneous Configurable Integrated Circuit", filed on Sep. 14, 2007, and assigned to the assignee of the present invention.

The present application also contains subject matter that may be related to the subject matter in U.S. application Ser. No. 11/855,761 entitled: "General Purpose Input/Output System and Method", filed on Sep. 14, 2007, and assigned to the assignee of the present invention.

All mentioned U.S. applications are hereby incorporated by reference.

BACKGROUND

A network may be considered a group of stations (e.g., personal computers, servers, mainframes, telephones, etc.) connected to exchange information (i.e., communicate). The transmission medium connecting the group of stations may contain wired and/or wireless segments (e.g., parallel two-wire, twisted pair, shielded pair, coaxial line, waveguide, fiber-optics, satellite, infra-red, etc.). Communication may take place using packets that are exchanged between two or more stations in the group of stations.

Network processing may be considered the management and movement of packet-based communication traffic using network processing hardware. Pattern matching is a key function performed in network processing applications. Pattern matching often includes searching and matching a sequence of characters within a string, or a sequence of bits within a word. Pattern matching may be performed by hardware and/or software systems.

SUMMARY

In general, in one aspect, the invention relates to a system for determining memory addresses. The system includes a first content-addressable memory (CAM) configured to generate a first matchvector based on a first key; a first inverse-mask-reverse (IMR) module operatively connected to the first CAM, where the first IMR module is configured to generate a first auxiliary matchvector based on the first matchvector; and a first priority encoder (PE) operatively connected to the first IMR module, where the first PE is configured to output a first encoded memory address based on the first auxiliary matchvector, where the first CAM, the first IMR module, and the first PE are associated with a first reconfigurable content-addressable memory (RCAM).

In general, in one aspect, the invention relates to a method for determining memory addresses. The method includes obtaining a first key; comparing the first key and a first cell row to determine a first match; generating a first matchvector based on the first match; outputting a first encoded memory address based on the first matchvector.

Other aspects of the invention will be apparent from the following description and the appended claims.

DETAILED DESCRIPTION

Figure 1:
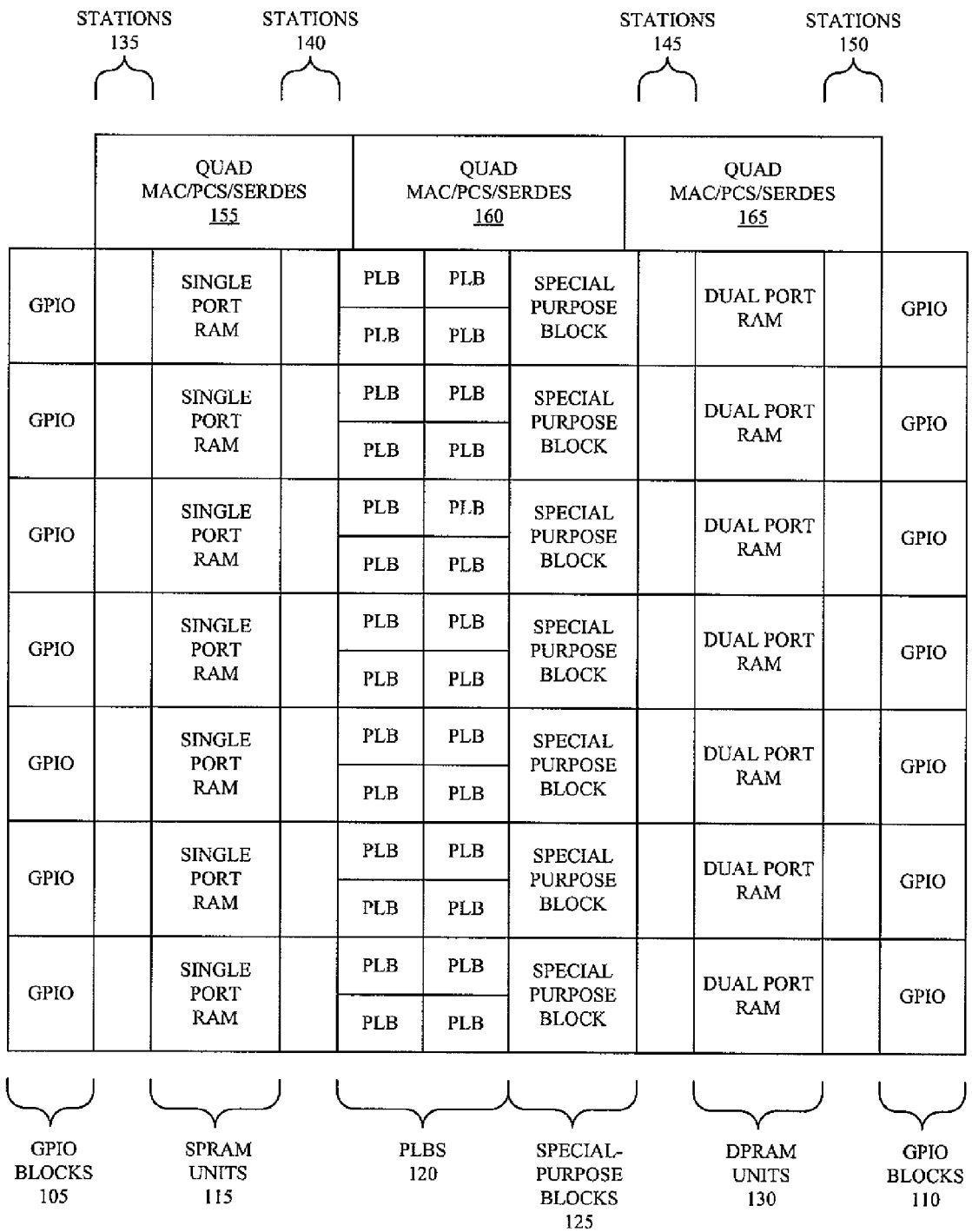
FIG. 1 shows a heterogeneous configurable integrated circuit in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide a method and system for determining a memory address. In general, embodiments of the invention provide a method and system for determining a memory address using one or more reconfigurable content-addressable memory (RCAM) units on a heterogeneous configurable integrated circuit.

FIG. 1 shows part of a heterogeneous configurable integrated circuit (HCIC) (100) in accordance with one or more embodiments of the invention. As shown in FIG. 1, the HCIC (100) has numerous components including one or more columns of general purpose input/output (GPIO) blocks (105, 110), at least one column of single port ram units (SPRAM) (115), multiple columns of PLBs (120), at least one column of special-purpose blocks (125), at least one column of dual port RAM units (DPRAM) (130), multiple columns of stations (135, 140, 145, 150), and multiple quad MAC/PCS/SERDES units (155, 160, 165) bordering the HCIC (100). In one or more embodiments of the invention, the HCIC (100) is fabricated on a monolithic semiconductor substrate.

Although FIG. 1 only shows quad MAC/PCS/SERDES units (155, 160, 165) bordering one side of the HCIC (100), those skilled in the art, having the benefit of this detailed description, will appreciate other embodiments of the invention include quad MAC/PCS/SERDES units on multiple sides of the HCIC (100). Additionally, although FIG. 1 only shows a single column of SPRAM units (115), two columns of programmable logic device blocks (PLBs) (120), and a single column of DPRAM units (130), those skilled in the art, having the benefit of this detailed description, will also appreciate the HCIC (100) may have any number of columns of the mentioned components.

In one or more embodiments of the invention, a special-purpose block (125) is a RCAM unit. Although FIG. 1 only shows a single column of special-purpose blocks (125), those skilled in the art, having the benefit of this detailed description, will also appreciate other embodiments of the invention have multiple columns of special-purpose blocks, where each column contains a single type of special-purpose block.

In one or more embodiments of the invention, the multiple stations (135, 140, 145, 150) form a data cross-connect (DCC) network. This DCC network is a two-dimensional grid of stations that spans the entire HCIC (100). In one or more embodiments of the invention, the DCC network is as described in U.S. application Ser. No. 11/901,182 entitled "High-Bandwidth Interconnect Network for an Integrated Circuit," which was previously incorporated by reference. In one or more embodiments of the invention, the HCIC (100) also includes a routing crossbar network (not shown) in a plane parallel to the DCC network.

Figure 2:
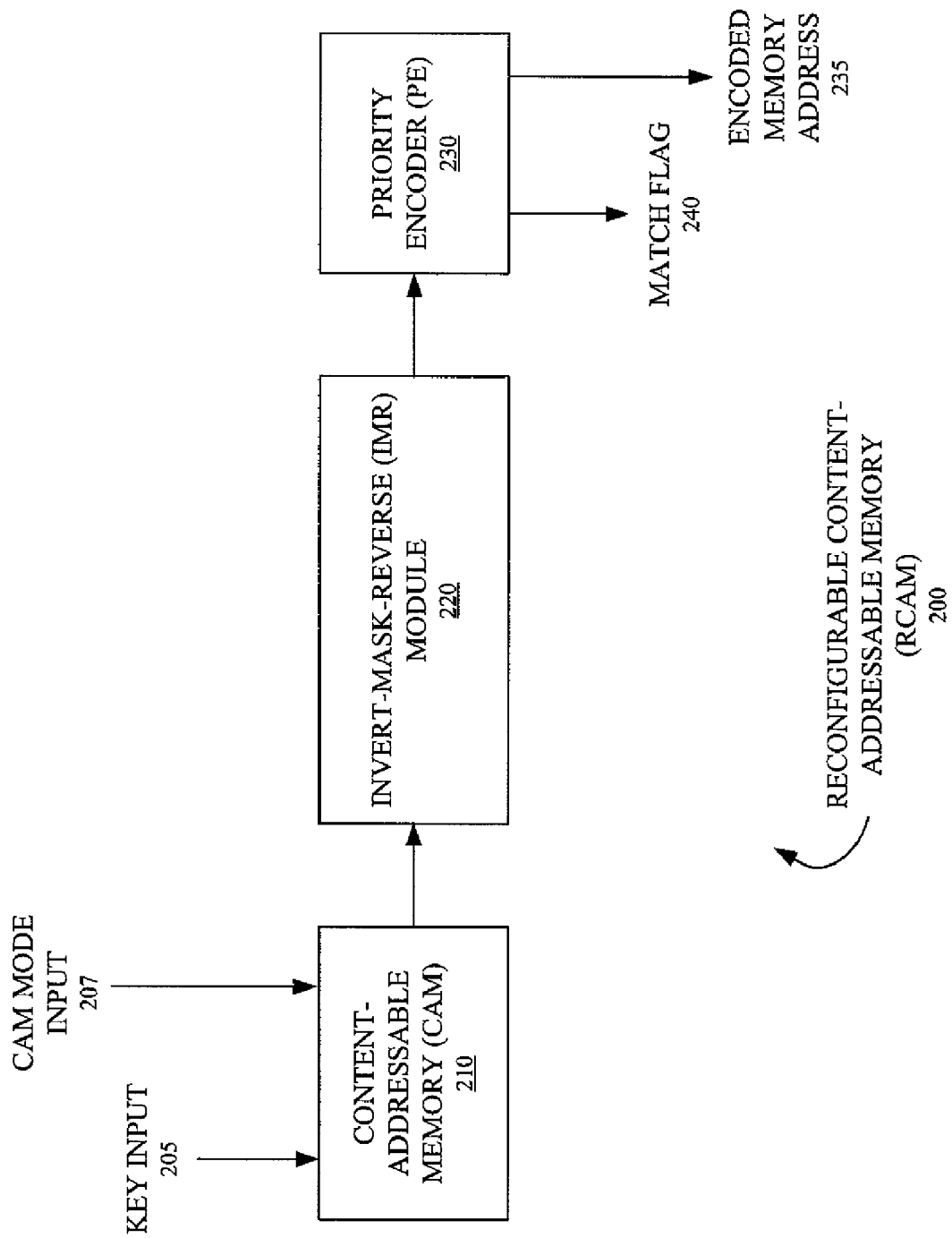
FIG. 2 shows a reconfigurable content-addressable memory (RCAM) in accordance with one or more embodiments of the invention.

In one or more embodiments of the invention, several of the special-purpose blocks (114, 116, 118) are RCAM units. FIG. 2 shows an RCAM unit (200) in accordance with one or more embodiments of the invention. As shown in FIG. 2, the RCAM unit (200) may have numerous components including a content-addressable memory (CAM) (210), an invert-mask-reverse module (IMR) (220), a priority encoder (PE) (230), and one or more configuration registers (not shown). The numerous components may be connected via a bus to exchange data. In addition, the CAM (210) and the PE (230) may be connected to the DCC network.

The RCAM (200) may have both a key (205) and a CAM mode (207) as inputs. The RCAM unit (200) may have both an encoded memory address (235) and a match flag (240) as outputs. In one or more embodiments of the invention, the key input (205) and the encoded memory address (235) are both an ordered set of bits (i.e., a bit vector). In one or more embodiments of the invention, the match flag (240) is a single bit. In one or more embodiments of the invention, the CAM mode input (207) is a boolean value toggling the operating mode of CAM (210) (discussed below). The multiple components of the RCAM (200) are discussed in detail below.

Figure 3:
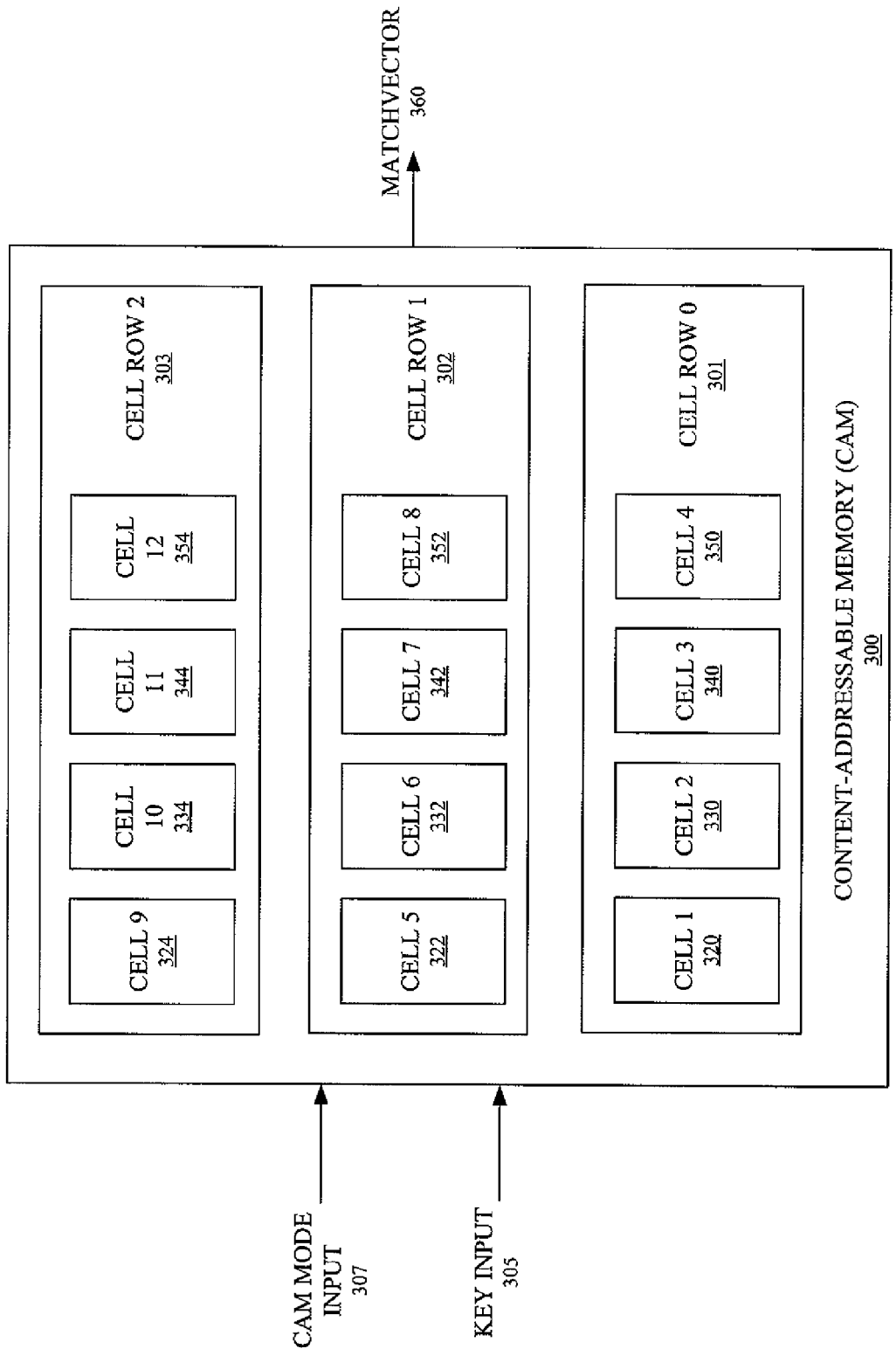
FIG. 3 shows a content-addressable memory (CAM) in accordance with one or more embodiments of the invention.

FIG. 3 shows a content-addressable memory (CAM) (300) in accordance with one or more embodiments of the invention. The CAM (210), the key input (205), and the CAM mode input (207), as discussed above in reference to FIG. 2, are essentially the same as the CAM (300), the key input (305), and the CAM mode input (307), respectively. The CAM (300) may include multiple cells (320, 322, 324, 330, 332, 334, 340, 342, 344, 350, 352, 354). Data may be written to one or more cells of the CAM (300) using a write bus (not shown). Similarly, the content of one or more cells of the CAM (300) may be read using a read bus originating from the CAM (300) (not shown). In one or more embodiments of the invention, each cell stores a bit of data.

In one or more embodiments of the invention, the multiple cells are organized into cell rows (301, 302, 303). As shown in FIG. 3, Cell 1 (320), Cell 2 (330), Cell 3 (340), and Cell 4 (350) may belong to Cell Row 0 (301). Similarly, Cell 5 (322), Cell 6 (332), Cell 7 (342), and Cell 8 (352) may belong to Cell Row 1 (302). Further still, Cell 9 (324), Cell 10 (334), Cell 11 (344), and Cell 12 (354) may belong to Cell Row 2 (303).

In one or more embodiments of the invention, each cell row is associated with a rank and a memory address within the CAM (300). Cell Row 0 (301) may have the lowest rank and may have a memory address of "0". Cell Row 1 (302) may have the second lowest rank and may have a memory address of "1". Cell Row 2 (303) may have the highest rank and may have a memory address of "2".

Although embodiments of the invention have been directed towards a CAM (300) having three cell rows each including four cells, those skilled in the art, having the benefit of this detailed description, will appreciate the CAM (300) may have any number of cell rows, with each cell row having the same number of cells. In one or more embodiments of the invention, the CAM (300) has $2^N$ cell rows, where $N \geq 0$. In one or more embodiments of the invention, the CAM (300) has sixty-four cell rows, with each cell row having forty cells.

In one or more embodiments of the invention, the CAM (300) operates in one of several modes including binary CAM (BCAM) mode, ternary CAM (TCAM) mode, and byte CAM (ByteCAM) mode. The operating mode of the CAM (300) may be specified by setting the CAM mode input (307) to "1", and by setting the configuration bits in an appropriate configuration register (not shown). Each operating mode of the CAM (300) is discussed in detail below. In one or more embodiments of the invention, when the CAM mode input (307) is "0", the CAM (300) operates as a static random access memory (SRAM). The cells of the CAM (300) may be accessed and/or modified using read/write buses (discussed above).

In one or more embodiments of the invention, when operating in BCAM mode, the key input (305) is compared against each cell row in the CAM (300). A match between the key input (305) and a cell row may exist when each and every cell in the cell row is identical to the corresponding element in the key input (305). In other words, when operating in BCAM mode, a match may exist when the first bit associated with the key input (305) is identical to the first cell of the cell row, the second bit associated with the key input (305) is identical to the second cell of the cell row, etc. Those skilled in the art, having the benefit of this detailed description, will appreciate the number of cells in the cell row may equal the size of the key input (305).

In one or more embodiments of the invention, when operating in TCAM mode, cells of each cell row are grouped into cell pairs (not shown). One cell of a cell pair may be referred to as a data mask. The other cell of a cell pair may be referred to as a data bit. Those skilled in the art, having the benefit of this detailed description, will appreciate the size of the key input (305) is equal to half the number of cells in a cell row. In other words, each bit of the key input (305) is associated with a cell pair in a cell row.

In one or more embodiments of the invention, the key input (305) is compared to each and every cell row of the CAM (300). A match may exist between the key input (305) and a cell row when every cell pair matches the corresponding bit in the key input (305). A cell pair matches a bit of the key input (305) when either (i) the data mask cell of the cell pair is "true", or (ii) the data bit of the cell pair equals the bit of the key input (305).

In one or more embodiments of the invention, when operating in ByteCAM mode, adjacent cells of each cell row are grouped into bytes. The key input (305) may also be grouped into bytes. A byte may include two or more cells. In one or more embodiments of the invention, a byte includes ten cells (i.e., ten bits). In one or more embodiments of the invention, the bytes of the cell row and the bytes of the key input (305) are of the same size.

The key input (305) may be compared to each and every cell row of the CAM (300). In one or more embodiments of the invention, in ByteCAM mode, a match exists between the key input (305) and a cell row, when the byte sequence of the key input (305) is identical to the byte sequence of the cell row. In one or more embodiments of the invention, in ByteCAM mode, the key input (305) is a sliding window acting on an incoming stream of bytes. Accordingly, bytes are added to one side of the window and removed from the opposite side of the window with the remaining bytes being shifted within the window. Following the shift, the new sequence of bytes may be compared to each and every cell row of the CAM (300) to determine whether a match exists.

In one or more embodiments of the invention, regardless of the operating mode of the CAM (300), the matchvector (360) is a bit vector used to identify which cell rows match the key input (305). Accordingly, the dimension of the matchvector (360) may be identical to the cardinality of the cell rows. For example, when the CAM (300) has $2^N$ cell rows, the matchvector (360) has $2^N$ bits, where $N \geq 0$. In other words, each bit of the matchvector (360) may be associated with a cell row. A bit of the matchvector (360) may be set to "1" when the cell row associated with the bit matches the key input (305). A bit of the matchvector (360) may be set to "0" when the cell row associated with the bit does not match the key input (305).

Figure 4:
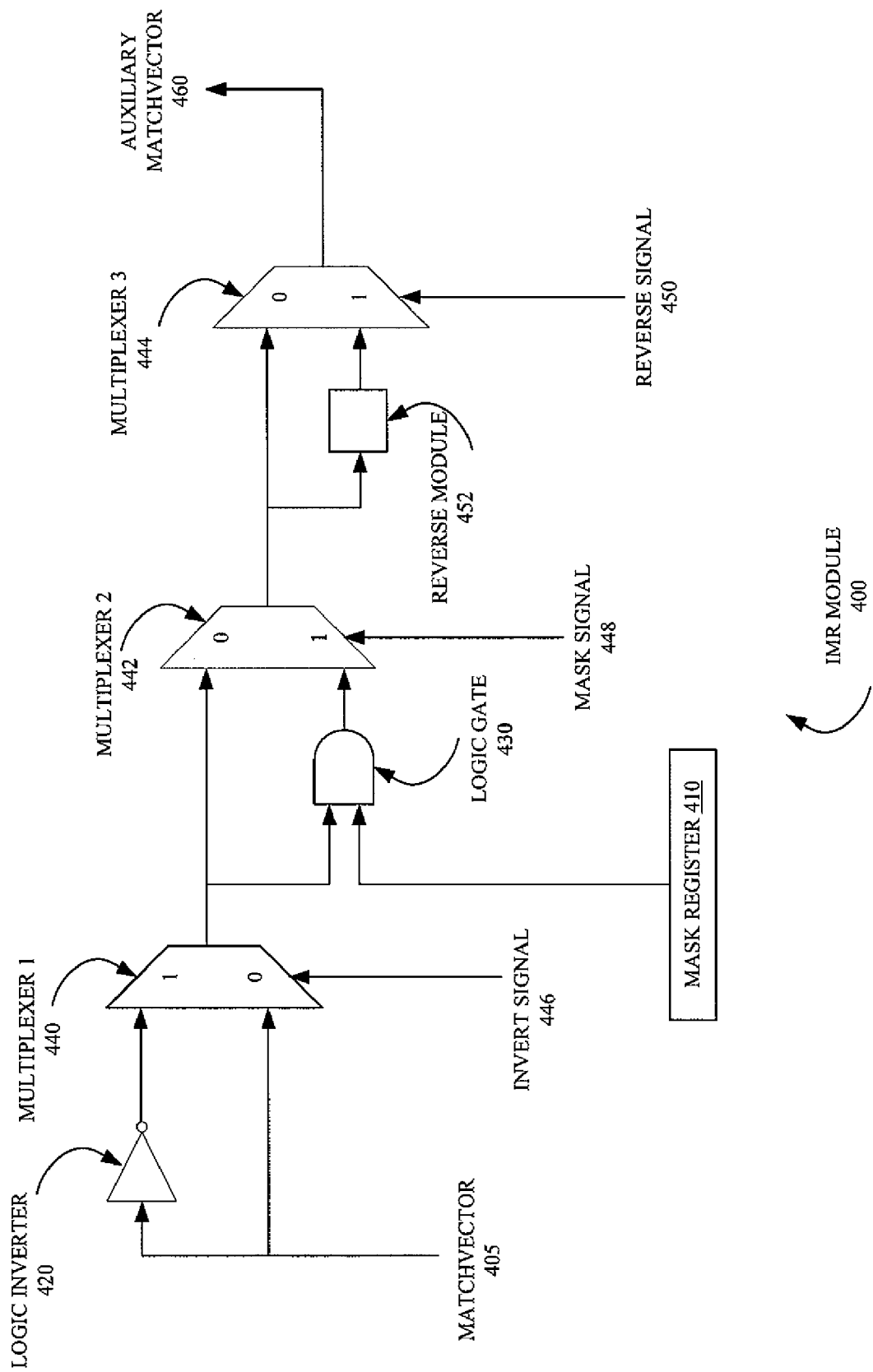
FIG. 4 shows an invert-mask-reverse (IMR) module in accordance with one or more embodiments of the invention.

Referring back to FIG. 2, the RCAM (200) may include an IMR module (220). FIG. 4 shows an IMR module (400) in accordance with one or more embodiments of the invention. As shown in FIG. 4, the IMR module (400) may have several components including a mask register (410), a logic inverter (420), a logic gate (430), one or more multiplexers (i.e., Multiplexer 1 (440), Multiplexer 2 (442), Multiplexer 3 (444)), and one or more control signals (i.e., Invert Signal (446), Mask Signal (448), and Reverse Signal (450)). The IMR module (400) may input matchvector (405) and may output auxiliary matchvector (460). Matchvector (405) may be essentially the same as matchvector (360) discussed above in reference to FIG. 3.

In one or more embodiments of the invention, the logic inverter (420) is used to invert the bits of the matchvector (405). Accordingly, by using the logic inverter (420) and setting the Invert Signal (446) to "1", the signal leaving Multiplexer 1 (440) is the inverted version of the matchvector (405). In contrast, by setting the Invert Signal (446) to "0", the signal leaving Multiplexer 1 (440) is essentially the same as the matchvector (405).

In one or more embodiments of the invention, the logic gate (430) is an "AND" gate used to mask the signal leaving Multiplexer 1 (440) with the contents of the mask register (410). In other words, the logic gate (430) performs a bitwise "AND" operation with the bits of the signal leaving Multiplexer 1 (440) and the bits of the mask register (410). Accordingly, by setting the Mask Signal (448) to "1", the signal leaving Multiplexer 2 (442) is a masked version of the signal leaving Multiplexer 1 (440). In contrast, by setting the Mask Signal (448) to "0", the signal leaving Multiplexer 2 (442) is essentially the same as the signal leaving Multiplexer 1 (440).

In one or more embodiments of the invention, the reverse module (452) reverses the bit order of the signal leaving Multiplexer 2 (442). Accordingly, by using the reverse module (452) and setting the Reverse Signal (450) to "1", the signal leaving Multiplexer 3 (444) (i.e., the auxiliary matchvector (460)) is a bit reversed version of the signal leaving Multiplexer 2 (442). In contrast, by setting the Reverse Signal (450) to "0", the auxiliary matchvector (460) is essentially the same as the signal leaving Multiplexer 2 (442).

Those skilled in the art, having the benefit of this detailed description, will appreciate that by setting the appropriate control signals (e.g., Invert Signal (446), Mask Signal (448), and Reverse Signal (450)) the matchvector (405) may be inverted, masked, and/or reversed. In one or more embodiments of the invention, by using the appropriate control signals, the auxiliary matchvector (460) may be essentially the same as the matchvector (405). Regardless of the values of the control signals, the dimension of the auxiliary vector (460) may be identical to the dimension of the matchvector (405). Thus, the dimension of the auxiliary matchvector (460) may be essentially the same as the cardinality of the cell rows in the CAM (300) (discussed above in reference to FIG. 3).

Figure 5:
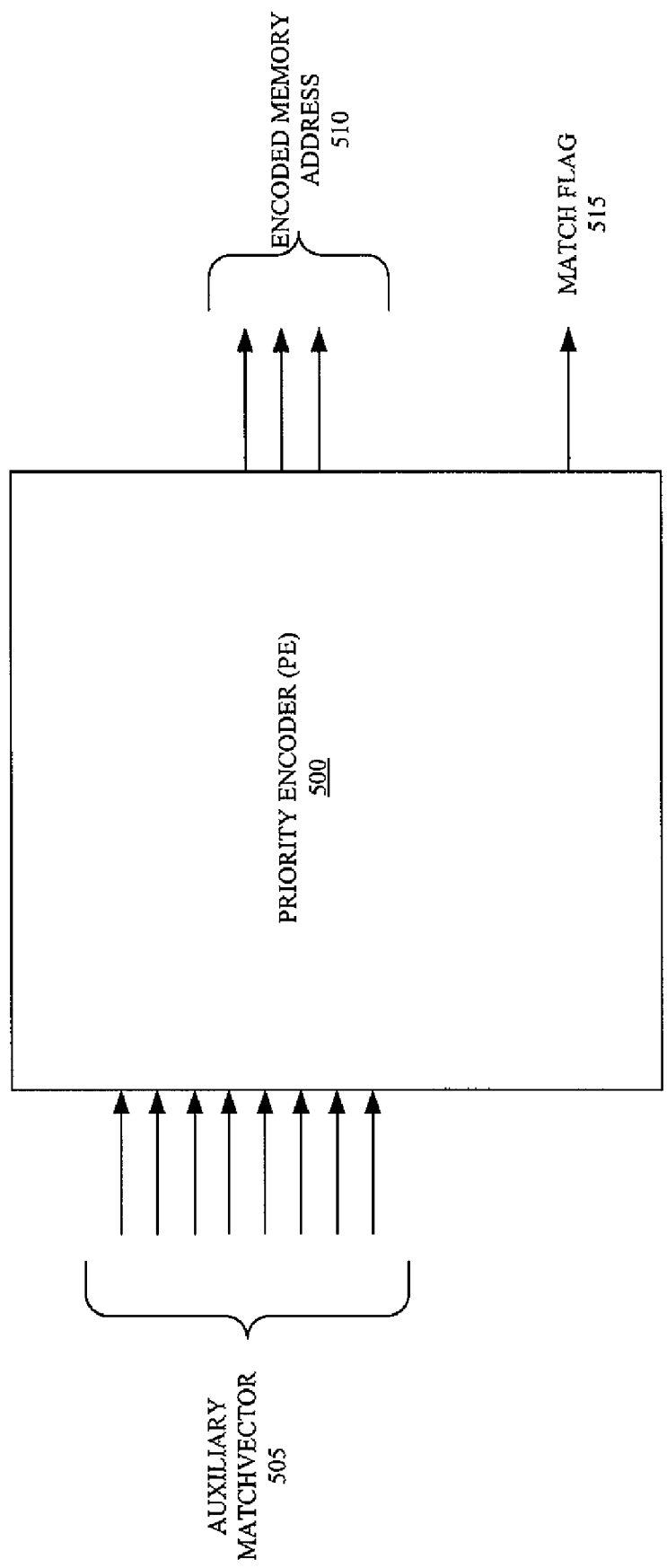
FIG. 5 shows a priority encoder (PE) in accordance with one or more embodiments of the invention.

Referring back to FIG. 2, the RCAM (200) may include a PE (230). FIG. 5 shows a PE (500) in accordance with one or more embodiments of the invention. The PE (230) discussed above in reference to FIG. 2 may be essentially the same as PE (500). As shown in FIG. 5, PE (500) may input an auxiliary matchvector (505) and may output an encoded memory address (510) and a match flag (515). The auxiliary matchvector (505) may be essentially the same as the auxiliary matchvector (460) discussed above in reference to FIG. 4. Similarly, the encoded memory address (510) and match flag (515) may be essentially the same as the encoded memory address (235) and match flag (240), respectively, as discussed above in reference to FIG. 2.

As discussed above, each bit in the auxiliary matchvector (505) may be associated with a cell row in a CAM (i.e., CAM (300) discussed in reference to FIG. 3). In one or more embodiments of the invention, the PE (500) is configured to (i) identify which bits of the auxiliary matchvector (505) are set to "1", (ii) determine which bit from all the bits set to "1" is associated with the cell row of highest rank in the CAM, and (iii) output the memory address in binary format (i.e., encoded memory address (515)) of the cell row. In one or more embodiments of the invention, the encoded memory address (515) is the memory address in binary format of the cell row of highest rank which matches a key input. In one or more embodiments of the invention, when at least one bit of the auxiliary matchvector (505) is set to "1", the PE (500) sets the match flag (515) to "1". In contrast, when no bits of the auxiliary matchvector (505) are set to "1", the PE (500) may set the match flag (515) to "0".

Figure 6:
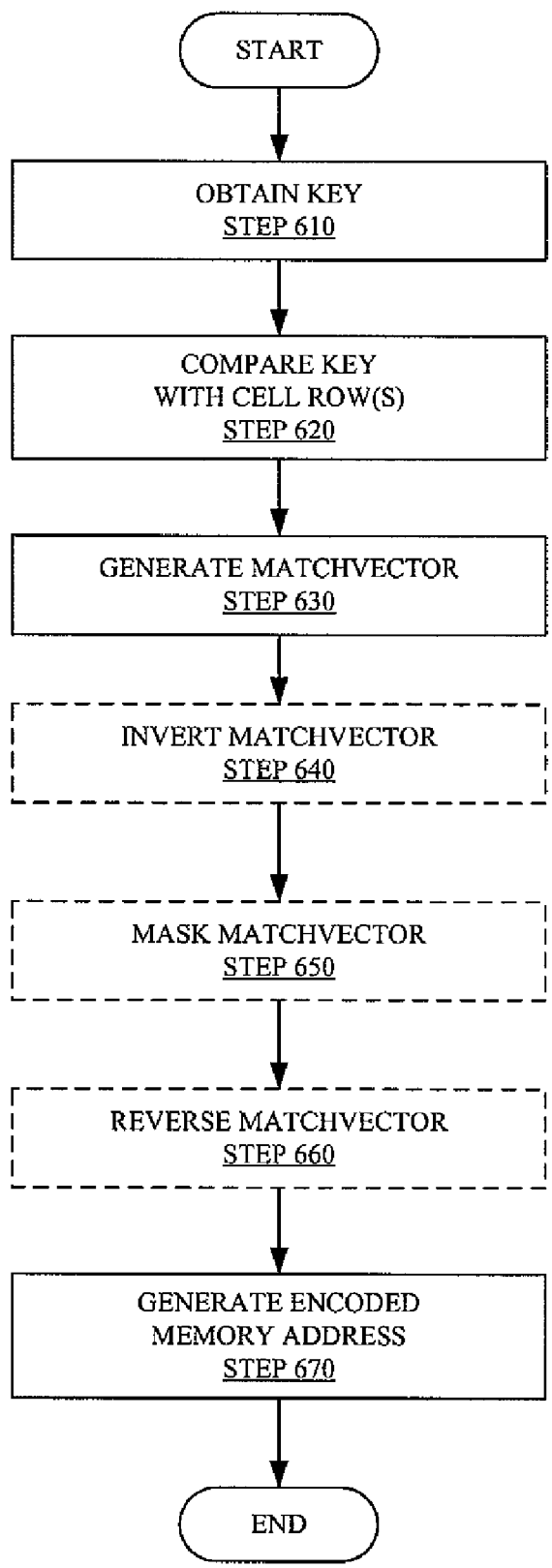
FIG. 6 shows a flowchart in accordance with one or more embodiments of the invention.

FIG. 6 shows a flowchart in accordance with one or more embodiments of the invention. Initially, a key is obtained (STEP 610). In one or more embodiments of the invention, the key is obtained from a DCC network of the heterogeneous configurable integrated circuit (100), discussed above in reference to FIG. 1. The key may be a bit vector and the bits may be obtained in parallel.

In STEP 620, the key is compared against one or more cell rows in a CAM to identify matches. In one or more embodiments of the invention, when the key is compared to multiple cell rows, the comparisons are conducted in parallel. In one or more embodiments of the invention, the definition of a match is dependent on the operation mode of the CAM (e.g., BCAM mode, TCAM mode, ByteCAM mode, etc.). Each cell row in the CAM may be associated with a rank.

In STEP 630, a matchvector is generated based on the one or more comparisons (STEP 620). In one or more embodiments of the invention, the matchvector is a bit vector. The size or dimension of the matchvector may be equal to the number of cell rows in the CAM. Accordingly, each bit of the matchvector may be associated with one of the cell rows. In one or more embodiments of the invention, when a bit of the matchvector is set to "1", the cell row associated with the bit matches the key obtain in STEP 610.

In STEP 640, the matchvector is inverted. Accordingly, a bit of the matchvector that was set to "0" may be inverted to "1", and a bit that was set to "1" may be inverted to "0". In one or more embodiments of the invention, STEP 640 is optional. A control signal may be used to trigger the inversion. Those skilled in the art, having the benefit of this detailed description, will appreciate the matchvector may be inverted to determine which cell rows of the CAM do not match the key obtained in STEP 610.

In STEP 650, the matchvector is masked. In one or more embodiments of the invention, the matchvector is masked by performing a bitwise "AND" operation with a mask value. For example, when the matchvector has a value of "01011010" and the mask value has a value of "10001001", the value of the matchvector following the masking may be "00001000". In one or more embodiments of the invention, STEP 650 is optional. A control signal may be used to trigger the masking. Those skilled in the art, having the benefit of this detailed disclosure, will appreciate that masking may be used to isolate a bit of the matchvector associated with a specific cell row.

In STEP 660, the bit order of the matchvector may be reversed. For example, a matchvector having a value of "01100000" has a value of "00000110" following the reversal. In one or more embodiments of the invention, the bit order of the matchvector is reversed to change the outcome of a priority encoder (discussed above). In one or more embodiments of the invention, STEP 660 is optional. A control signal may be used to trigger the bit reversal. In one or more embodiments of the invention, the matchvector may be referred to as the auxiliary matchvector after STEP 640, STEP 650, and/or STEP 660.

In STEP 670, an encoded memory address is generated based on the auxiliary matchvector. In one or more embodiments of the invention, in order to generate the encoded memory address, it is required to (i) determine all the bits of the auxiliary vector that are set to "1", and (ii) determine which bit from all the bits set to "1" is associated with the cell row of highest rank. The encoded memory address may be the memory address in binary format of this highest ranked cell row. In one or more embodiments of the invention, when the auxiliary matchvector is of size $2^N$, the encoded memory address is a binary value of size N, where $N \geq 0$. In one or more embodiments of the invention, the encoded memory address is the memory address in binary format of the highest ranking cell row that matched the key obtained in STEP 610.

Figure 7:
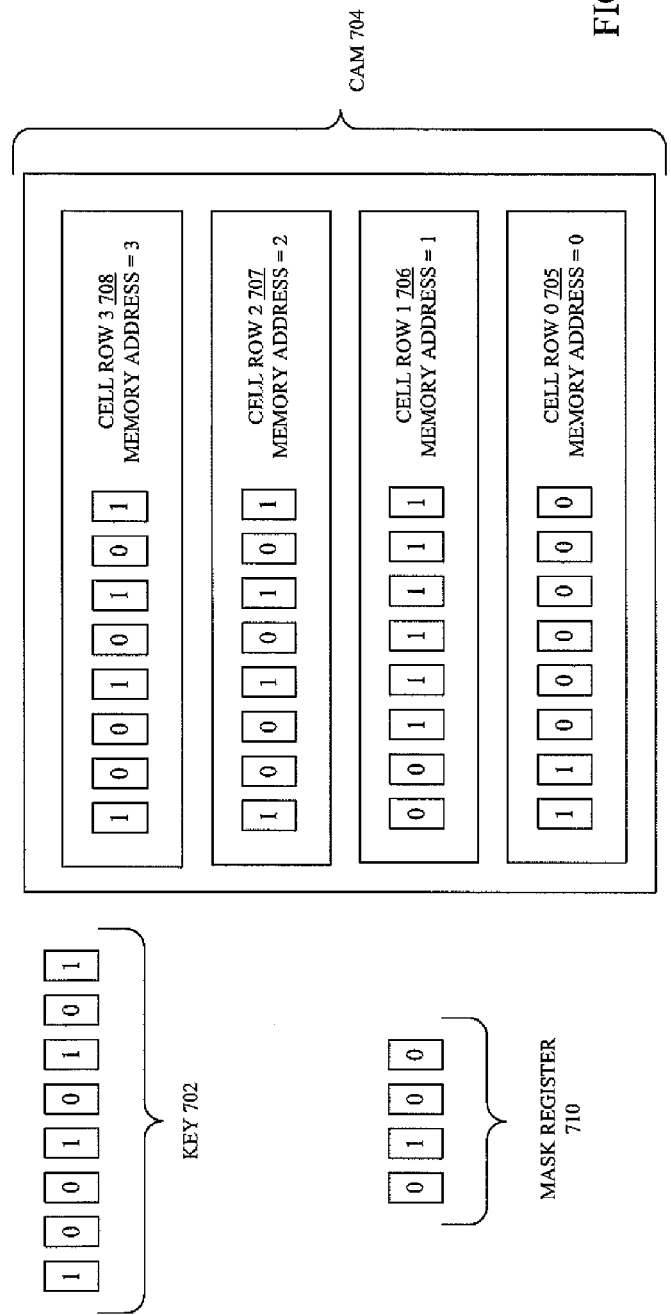
FIGS. 7 and 8 show examples in accordance with one or more embodiments of the invention.
Figure 7:
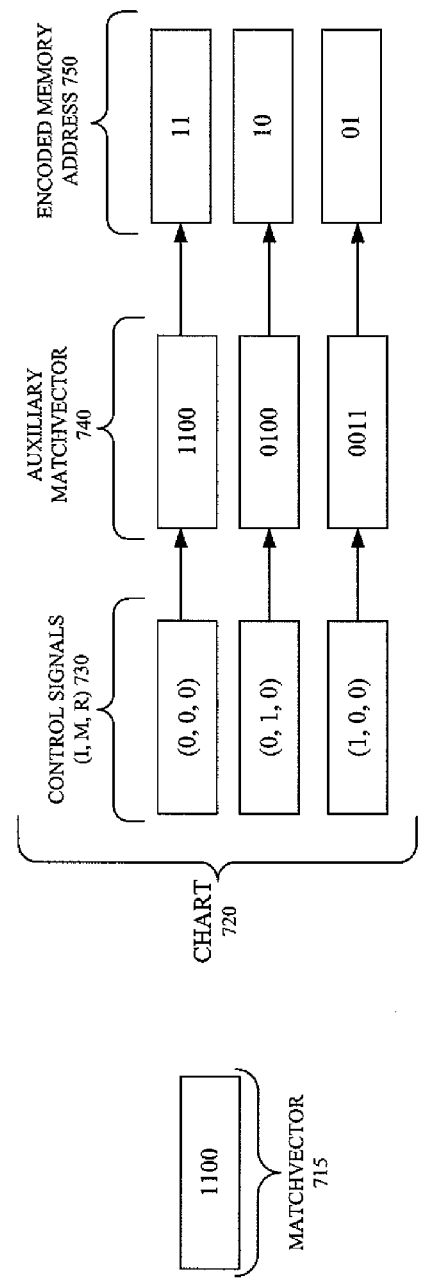

FIG. 7 shows an example in accordance with one or more embodiments of the invention. The example shown in FIG. 7 is not meant to limit the invention in any way. In the example, it is assumed the key (702) has a value of "10010101", the mask register (710) has a value of "0100", and the CAM (704) has four cell rows (i.e., Cell Row 0 (705), Cell Row 1 (706), Cell Row 2 (707), and Cell Row 3 (708)), with each row having eight cells. It is also assumed that Cell Row 0 (705) has a memory address of "0", Cell Row 1 (706) has a memory address of "1", Cell Row 2 (707) has a memory address of "2", and Cell Row 3 (708) has a memory address of "3". It is further assumed that (i) Cell Row 3 (708) has the highest rank in CAM (704), (ii) Cell Row 0 (705) has the lowest rank in the CAM (704), and (iii) the CAM is operating in BCAM mode (discussed above in reference to FIG. 2).

Those skilled in the art, having the benefit of this detailed description, will appreciate both Cell Row 3 (708) and Cell Row 2 (707) match the key (702), while neither Cell Row 0 (705) nor Cell Row 1 (706) matches the key (702). Further, those skilled in art, having the benefit of this detailed description, will also appreciate that after comparing and matching the key (702) with each and every cell row of CAM (704), the generated matchvector (715) has a value of "1100". The first two bits of the generated matchvector are set as "1" because the first bits are associated with the two cell rows (i.e., Cell Row 3 (708) and Cell Row 2 (707)) matching the key (702).

Still referring to FIG. 7, the chart (720) shows three different sets of control signals (730), and the auxiliary matchvectors (740) and encoded memory addresses (750) that result because of the control signals (730). The first, second, and third components of the control signals (730) are the invert (I), mask (M), and reverse (R) signals, respectively.

As shown by the chart (720), when the control signal has a value of (0,0,0), the auxiliary matchvector (740) may be identical to the matchvector (715). Accordingly, the auxiliary matchvector has a value of "1100". Both the first and the second bits of the auxiliary matchvector (740) are set to "1". The first bit of the auxiliary vector (740) is associated with Cell Row 3 (708). The second bit of the auxiliary vector (740) is associated with Cell Row 2 (707). As the rank of Cell Row 3 (708) is greater than the rank of Cell Row 2 (707), the encoded memory address (750) is the memory address of Cell Row 3 (708) in binary format (i.e., "11"). Cell Row 3 (708) is the highest ranked cell row that matches the key (702).

As shown by the chart (720), when the control signal (730) has a value of (0,1,0), the matchvector is masked using the contents of the mask register (710) to generate the auxiliary matchvector (740). Accordingly, after performing a bitwise "AND" operation with the matchvector (715) and the mask register (710) (i.e., masking), the resulting auxiliary matchvector (740) has a value of "0100". The only bit of the auxiliary matchvector set to "1" is the second bit. The second bit of the auxiliary matchvector is associated with Cell Row 2 (707). Accordingly, the encoded memory address (750) is the memory address of Cell Row 2 (707) in binary format (i.e., "10").

As shown by the chart (720), when the control signal has a value of (1,0,0), the auxiliary vector (740) is an inverted version of the matchvector (715). Accordingly, the auxiliary vector has a value of "001111". Both the third and the fourth bits of the auxiliary vector (740) are set to "1". The third bit of the auxiliary vector (740) is associated with Cell Row 1 (706). The second bit of the auxiliary vector (740) is associated with Cell Row 0 (705). As the rank of Cell Row 1 (706) is greater than the rank of Cell Row 0 (705), the encoded memory address (750) is the memory address in binary of Cell Row 1 (705) (i.e., "01"). Cell Row 1 (706) is the highest ranked cell row that did not match the key (702).

Figure 8:
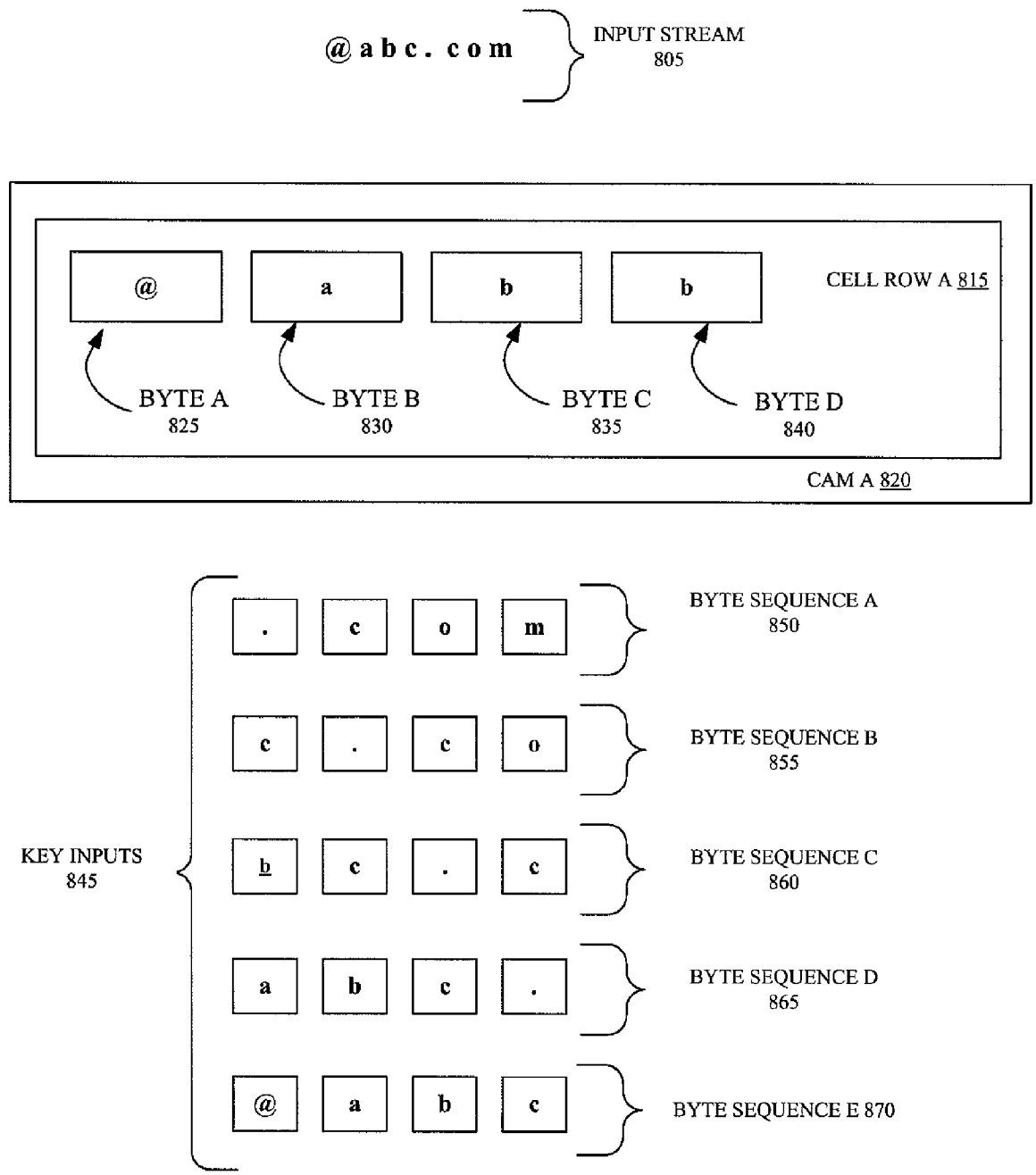

FIG. 8 shows an example in accordance with one or more embodiments of the invention. The example shown in FIG. 8 is not meant to limit the invention in any way. In FIG. 8, assume the input stream (805) is a sequence of characters, where each character (e.g., '@', 'a', 'b', '.', etc.) is represented by a byte. Also assume that Cell Row A (815) is a row in CAM A (820) and Cell Row A (815) includes four bytes (i.e., Byte A (825), Byte B (830), Byte C (835), Byte D (840)). Finally, assume CAM A (820) is configured to operate in ByteCAM mode. Accordingly, the key inputs (845) to CAM A (820) are byte sequences (i.e., Byte Sequence A (850), Byte Sequence B (855), Byte Sequence C (860), Byte Sequence D (865), Byte Sequence E (870)) obtained from a sliding window of size four bytes acting on the input stream (805).

Those skilled in the art, having the benefit of this detailed disclosure, will appreciate each byte sequence is obtained by adding a new byte of the input stream (805) to the previous byte sequence, removing a byte from the previous byte sequence, and shifting the remaining bytes in the previous byte sequence. For example, Byte Sequence E (870) is obtained by adding the byte representing the character '@' to Byte Sequence D (865), removing the byte representing the character '.' from Byte Sequence D (865), and shifting the bytes representing characters 'a', 'b', and 'c' in Byte Sequence D (865). Those skilled in the art, having the benefit of this detailed description, will also appreciate that only Byte Sequence E (870) matches Cell Row A (815) when Byte Sequence E (870) is provided as a key input to CAM A (820).

Figure 9:
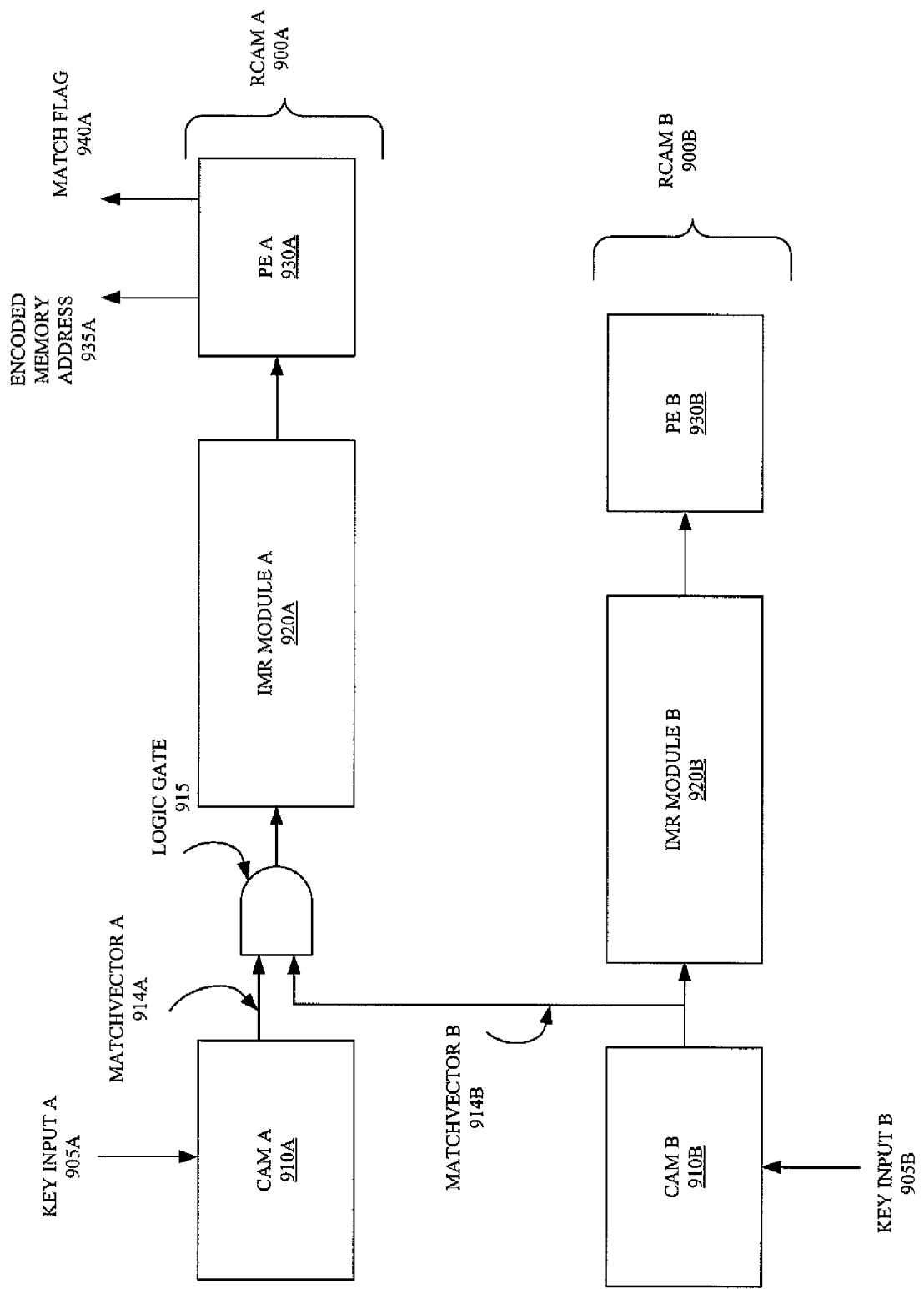
FIG. 9 shows a wide RCAM in accordance with one or more embodiments of the invention.

In one or more embodiments of the invention, the size of the key input may exceed the number of cells in a cell row of a CAM. Accordingly, it may be required to implement a wide RCAM using multiple, smaller RCAMs. FIG. 9 shows a wide RCAM implemented using two smaller RCAMs (i.e., RCAM A (900A), RCAM B (900B)) in accordance with one or more embodiments of the invention. Both RCAM A (900A) and RCAM B (900B) may be essentially the same as RCAM (200) discussed above in reference to FIG. 2. Both RCAM A (900A) and RCAM B (900B) may include a content-addressable memory (i.e., CAM A (910A), CAM B (910B)), an invert-mask-reverse module (IMR Module A (920A), IMR Module B (920B)), and a priority encoder (i.e., PE A (930A), PE B (930B)). RCAM A (900A) may also include a logic gate (915). The logic gate (915) may be an "AND" gate.

In one or more embodiments of the invention, a key input is partitioned into Key Input A (905A) and Key Input B (905B). Key Input A (905A) may be compared with the cell rows of CAM A (910A). Key Input B (905B) may be compared with the cell rows of CAM B (910B). A bitwise "AND" operation may be performed on the generated matchvectors (i.e., Matchvector A (914A), Matchvector B (914B)). The result of the bitwise "AND" operation may be input into IMR Module A (920A). Those skilled in the art, having the benefit of this detailed description, will appreciate the structure shown in FIG. 9 may allow for RCAM A (900A) and RCAM B (900B) to be treated as a single RCAM capable of handling the wide key value (i.e., the concatenation of Key Input A (905A) and Key Input B (905B)). In one or more embodiments of the invention, only the outputs of one RCAM (i.e., the encoded memory address (935A) and the Match Flag (940A)) are used.

Figure 10:
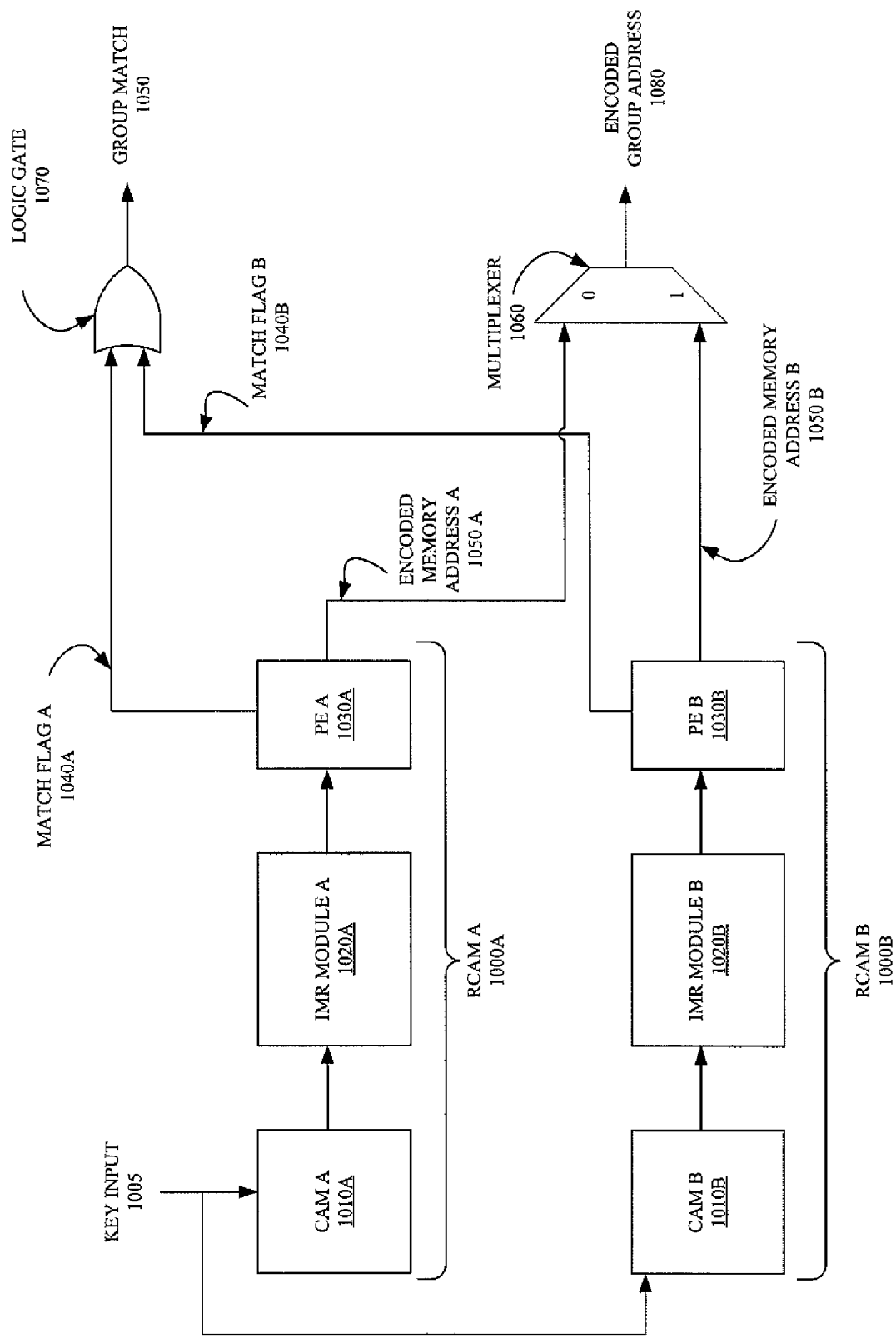
FIG. 10 shows a deep RCAM in accordance with one or more embodiments of the invention.

In one or more embodiments of the invention, it may be required for a key input to be compared against Z cell rows, where Z exceeds the number of cell rows in an RCAM. Accordingly, it may be required to implement a deep RCAM using multiple, smaller RCAMs. FIG. 10 shows a deep RCAM implemented using two smaller RCAMs (i.e., RCAM A (1000A), RCAM B (1000B)) in accordance with one or more embodiments of the invention. Both RCAM A (1000A) and RCAM B (1000B) may be essentially the same as the RCAM (200) discussed above in reference to FIG. 2. Both RCAM A (1000A) and RCAM B (1000B) may include a content-addressable memory (i.e., CAM A (1010A), CAM B (1010B)), an invert-mask-reverse module (IMR Module A (1020A), IMR Module B (1020B)), and a priority encoder (i.e., PE A (1030A), PE B (1030B)). The deep RCAM may also include a logic gate (1070) and a multiplexer (1060). The logic gate (1070) may be an "OR" gate. In one or more embodiments of the invention, the multiplexer is implemented using a programmable logic device block on the heterogeneous configurable integrated circuit (100), as discussed above in reference to FIG. 1.

In one or more embodiments of the invention, the identical key input (1005) is compared against the cell rows of both CAM A (1010A) and CAM B (1010B). An "OR" operation may be performed on the resulting match flags (i.e., Match Flag A (1040A), Match Flag B (1040B)) to determine whether at least one cell row in at least one of RCAM A (1010A) and RCAM B (1010B) matches the key input (1005). The "OR" operation may be performed by the logic gate (1070) and the result of the "OR" operation may be referred to as the group match flag (1050). Both RCAM A (1000A) and RCAM B (100B) generate an encoded memory address (i.e., Encoded Memory Address (1050A), Encoded Memory Address B (1050B)). A multiplexer (1060) may be used to select the encoded memory address associated with the match. The output of the multiplexer (1060) may be referred to as the encoded group address.

Those skilled in the art, having the benefit of this detailed description, will appreciate that one or more embodiments of the invention are suitable for use in a network security detection system, specifically to prevent attacks from the network using known pattern-matching rules for inspecting the frame body.

Those skilled in the art, having the benefit of this detailed description, will appreciate that one or more embodiments of the invention are suitable for pattern matching techniques used in packet payload inspection applications such as content-switching and server load-balancing.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system for determining memory addresses comprising:
    a first content-addressable memory (CAM) configured to generate a first matchvector based on a first key;
    a first inverse-mask-reverse (IMR) module operatively connected to the first CAM, wherein the first IMR module is configured to generate a first auxiliary matchvector based on the first matchvector; and
    a first priority encoder (PE) operatively connected to the first IMR module, wherein the first PE is configured to output a first encoded memory address based on the first auxiliary matchvector,
    wherein the first CAM, the first IMR module, and the first PE are associated with a first reconfigurable content-addressable memory (RCAM).

2. The system of claim 1, wherein the first CAM comprises:
    a plurality of cells,
    wherein each of the plurality of cells is associated with one of a plurality of cell rows,
    wherein each of the plurality of cell rows is associated with a memory address, and
    wherein each of the plurality of cell rows are ranked.

3. The system of claim 2, wherein the first key matches at least one of the plurality of cell rows.

4. The system of claim 2, wherein each of the plurality of cell rows comprises a byte.

5. The system of claim 2, wherein a dimension of the first matchvector and a cardinality of the plurality of cell rows are equal.

6. The system of claim 1, wherein the first CAM is configured to operate in at least one mode selected from a group consisting of binary CAM (BCAM) mode, ternary CAM (TCAM) mode, and byte CAM (ByteCAM) mode.

7. The system of claim 1, wherein the first IMR module comprises a mask register.

8. The system of claim 1, wherein the first IMR module comprises a bit inverter.

9. The system of claim 1, wherein the first RCAM is a special-purpose block on a heterogeneous configurable integrated circuit.

10. The system of claim 1, further comprising:
a second CAM configured to generate a second matchvector based on a second key, wherein the second CAM is operatively connected to the first IMR module.

11. The system of claim 10, wherein the first encoded memory address is associated with at least one selected from a group consisting of the first CAM and the second CAM.

12. The system of claim 1, further comprising:
a second CAM configured to generate a second matchvector based on the first key;
a second IMR module operatively connected to the second CAM, wherein the second IMR module is configured to generate a second auxiliary matchvector based on the second matchvector; and
a second PE operatively connected to the second IMR module,
wherein the second CAM, the second IMR module, and the second PE are associated with a second reconfigurable content-addressable memory (RCAM).

13. The system of claim 12, further comprising:
a programmable logic device (PLD) operatively connected to the first PE and the second PE.

14. The system of claim 12, wherein the first RCAM unit and the second RCAM unit abut on a heterogeneous configurable integrated circuit.

15. A method for determining memory addresses comprising:
obtaining a first key;
comparing the first key and a first cell row to determine a first match; generating a first matchvector based on the first match;
outputting a first encoded memory address based on the first matchvector; and
byte shifting the first key prior to comparing the first key and the first cell row.

16. A method for determining memory addresses comprising:
obtaining a first key;
comparing the first key and a first cell row to determine a first match; generating a first matchvector based on the first match;
outputting a first encoded memory address based on the first matchvector; and
inverting the first matchvector prior to outputting the first encoded memory address.

17. The method of claim 15, further comprising:
reversing the first matchvector prior to outputting the first encoded memory address.

18. The method of claim 15, further comprising:
masking the first matchvector prior to outputting the first encoded memory address.

19. The method of claim 15, wherein the first cell row is associated with a content-addressable memory (CAM).

20. The method of claim 19, wherein comparing the first key and the first cell row comprises determining an operating mode of the CAM.

21. The method of claim 15, wherein outputting the first encoded memory address comprises using a priority encoder.

22. The method of claim 15, wherein the first plurality of cells is associated with a reconfigurable content-addressable memory (RCAM), wherein the RCAM is a special-purpose block on a heterogeneous configurable integrated circuit.

23. The method of claim 15, further comprising:
obtaining a second key;
comparing the second key and a second cell row to determine a second match; and generating a second matchvector based on the second match,
wherein outputting the first encoded memory address is further based on the second matchvector.

24. The method of claim 15, further comprising:
comparing the first key and a second cell row to determine a second match; and generating a second matchvector after comparing the first key and the second cell row.

* * * * *